US011190002B2

(12) United States Patent
Winick et al.

(10) Patent No.: US 11,190,002 B2
(45) Date of Patent: Nov. 30, 2021

(54) CIRCUITS TO IDENTIFY PROTECTION DEVICE FAILURES

(71) Applicant: Hewlett Packard Enterprise Development LP, Houston, TX (US)

(72) Inventors: Bradley D. Winick, Fort Collins, CO (US); Christopher C. Wanner, Tomball, TX (US); Howard Leverenz, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 784 days.

(21) Appl. No.: 15/880,845

(22) Filed: Jan. 26, 2018

(65) Prior Publication Data
US 2019/0237959 A1 Aug. 1, 2019

(51) Int. Cl.
*H02H 3/00* (2006.01)
*H02H 1/00* (2006.01)
*H02H 11/00* (2006.01)
*H02H 3/08* (2006.01)
*G01R 31/74* (2020.01)

(52) U.S. Cl.
CPC .......... *H02H 1/0007* (2013.01); *G01R 31/74* (2020.01); *H02H 3/08* (2013.01); *H02H 11/005* (2013.01)

(58) Field of Classification Search
None
See application file for complete search history.

(56) References Cited

U.S. PATENT DOCUMENTS

| 4,618,906 A | * | 10/1986 | Paice | H02H 3/023 |
| | | | | 361/5 |
| 6,219,215 B1 | * | 4/2001 | Bertin | H01L 23/5256 |
| | | | | 361/93.8 |
| 8,724,283 B1 | | 5/2014 | Auguste et al. | |
| 9,765,750 B2 | * | 9/2017 | Ferguson | F02P 15/10 |
| 2014/0117774 A1 | | 5/2014 | McGill et al. | |
| 2015/0300312 A1 | | 10/2015 | Ferguson et al. | |
| 2017/0155244 A1 | | 6/2017 | Dickey et al. | |

FOREIGN PATENT DOCUMENTS

CN 102781145 11/2012

OTHER PUBLICATIONS

Vishay; "Failure Modes and Fusing of TVS Devices"; Nov. 15, 2016; 3 pages.

* cited by examiner

*Primary Examiner* — Stephen W Jackson
(74) *Attorney, Agent, or Firm* — Brooks, Cameron & Huebsch, PLLC

(57) ABSTRACT

Examples herein relate to an apparatus. In some examples, an apparatus may include a circuit to direct a power signal to at least one electrical component. The circuit may include a protection device to regulate power to the electrical component, detection circuitry to detect when the protection device has failed, and an alert handling logic to receive a signal from the detection circuitry that the protection device has failed.

20 Claims, 3 Drawing Sheets

CIRCUITS TO IDENTIFY PROTECTION DEVICE FAILURES

BACKGROUND

Electronic and/or mechanical devices may be connected to an apparatus including circuitry to provide power to the electronic and/or mechanical device. A protection device may be connected to a circuit to protect electronic and/or mechanical devices from damage.

DETAILED DESCRIPTION

Figure 1:
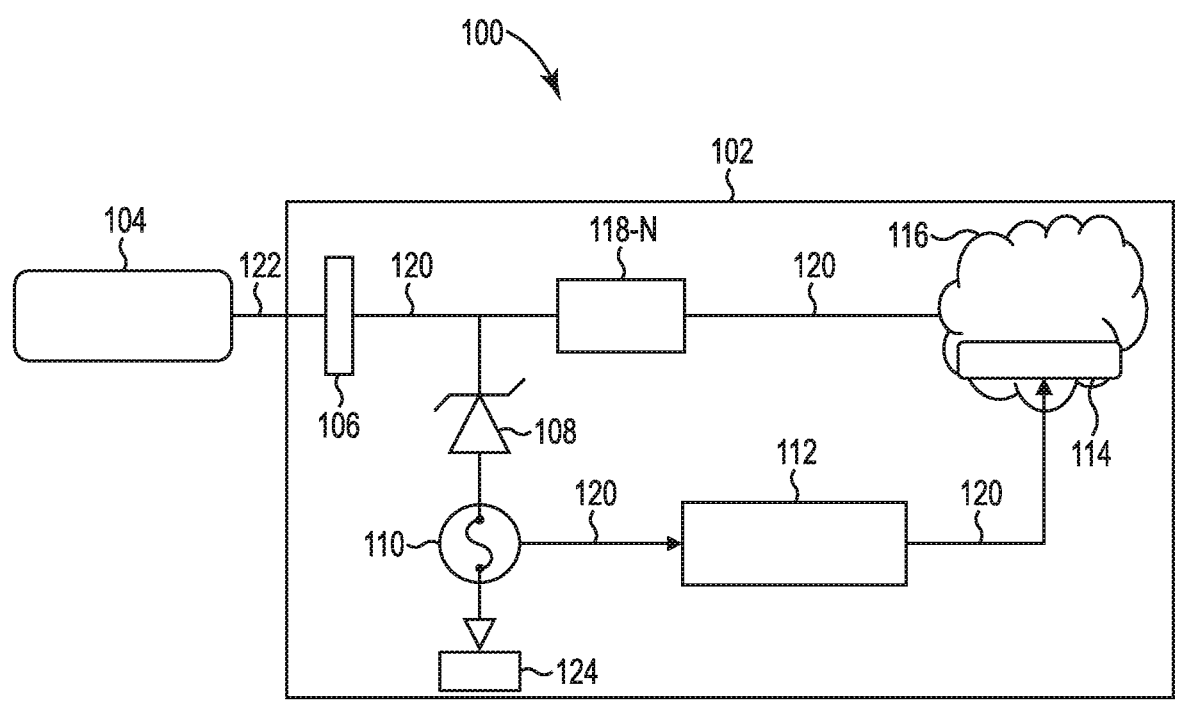
FIG. 1 illustrates an example of an apparatus including a circuit to identify protection device failures consistent with the disclosure.

Electronic and/or mechanical devices may be connected to an apparatus including circuitry to provide power to the electronic and/or mechanical device. A protection device may be connected to a circuit to protect electronic and/or mechanical devices from damage. Some circuits may include detection circuitry to detect a failure of the protection device. For example, a power supply may be connected to a circuit to provide power to an electrical component (e.g. an electronic device), the circuit may include a protection device to regulate power in response to a power surge.

As used herein, a "protection device" is an asymmetric conductance component that may be utilized when connected to a circuit to protect electronic and/or mechanical devices (e.g. a computing device) from damage from power surges and/or voltage spikes. Example asymmetric conductance components may be a Transient Voltage Suppressor (TVS) diode, a TRANSIL™, a thyrector, a diode, a metal-oxide varistor, an avalanche diode, a zener diode, a gas discharge tube, and/or another suitable electrical component that conducts current in one direction etc., which may be connected to a circuit powering an electrical component. For example, the protection device may be connected to the circuit powering the electrical component to respond to an overvoltage condition caused by either external or internal events (e.g. lightning and/or electric arcs).

As used herein, the term "fuse" refers to an electrical safety device that operates to provide overcurrent protection of an electrical circuit and may be a sacrificial device. For example, when a fuse experiences an amount of current exceeding the maximum fuse current rating the fuse operates by creating an open circuit, thus creating an open fuse. As used herein, the term "open fuse" means that a fuse has operated for its intended purpose and is no longer viable.

The protection device may include a protection fuse and the protection device may be connected to the circuit before the protection fuse. As used herein, the term "before the protection fuse" means that power from a power source encounters the protection fuse after the protection device. For example, as power transfers from the power source and into the circuitry of the circuit, the voltage will encounter the protection device first and may encounter the protection fuse second and/or when the protection device fails. In the preceding example, the protection device may fail when it is subjected to voltages and/or conditions outside of what the protection device may accommodate (e.g. open failure mode, short failure mode, and/or when the device is degraded).

In some examples, a failure of a protection device may result in the replacement of the protection device, the protection fuse, and/or the circuit to insure the continued protection of the electrical component. For example, in the event of the failure of the protection device, the protection fuse may open to ground the excess power. As used herein, the term "ground" is a reference point in a circuit where voltage may be measured, a return path for electric current and/or a technical or physical connection to earth to direct current flow in the event of current leakage or current overload. In the preceding example, the circuitry may be out of view of a user and the failure of the protection device may go unnoticed, thus leaving the electrical component unprotected. In the preceding example, a user or a machine may not be notified that a failure event has occurred until the electrical component sustains damage and/or loses power.

In some approaches, a protection device may be arranged in series with a protection fuse within a circuit containing circuitry to power an electrical component (e.g. an electronic device). For example, an electrical component may be powered by a power source connected through circuitry including a protection device and a protection fuse such that a power signal (e.g. a voltage) may translate from the power source and provide power the electrical component. Continuing with the preceding example, when the protection device experiences voltages and/or conditions outside of what the protection device may accommodate the protection device may experience a failure and the protection fuse may open in response to the failure. Continuing with this example, a failure of the protection device and the open protection fuse may go unnoticed by a user or a machine, and as noted above, the circuit is out of view thus rendering the electrical component unprotected.

In some approaches, as described above, an unprotected electrical component may be damaged in the event of a power surge, a voltage spike, and/or other external or internal events. For example, a circuit may have a damaged protection device and an open protection fuse resulting from an event (e.g. a power surge) experienced by a circuit powering an electrical component, thus rendering the electrical component unprotected. Continuing with the preceding example, if the circuit experiences a second event (e.g. a second power surge) the electrical component may be damaged.

In contrast, examples herein may allow for detection circuitry to detect when the protection fuse is open in response to a failed protection device. This may allow for the detection circuitry to generate an alert responsive to a failure of the protection device. The alert may indicate the failure of the protection device and signify to a user that the electrical component is unprotected. This may allow a user or a system containing the circuitry to take appropriate action to protect the electrical component, thus preventing damage, as opposed to some previous approaches where a user or system is unaware of a protection device failure when the electrical component experiences damage.

For example, a protection device may experience a failure (e.g. a short circuit), and a protection fuse may operate (e.g. the fuse may open) in response to the failed protection device, then a detection circuitry may detect a signal (e.g. a voltage) and generate an alert to signal an end user, a system, and/or a machine to take appropriate action to protect the electrical component. As used herein, "appropriate action" means an action to protect the designated device (e.g. the electrical component) from potential damage. This may include replacing the protection fuse, replacing the protection device, replacing a component of the circuit, replacing the entire circuit, and/or the apparatus, and/or refraining from powering the unprotected electrical component, etc.

The figures herein follow a numbering convention in which the first digit corresponds to the drawing figure number and the remaining digits identify an element or component in the drawing. For example, reference numeral 100 may refer to element "00" in FIG. 1 and an analogous element may be identified by reference numeral 200 in FIG. 2. Elements shown in the various figures herein can be added, exchanged, and/or eliminated so as to provide a number of additional examples of the disclosure. In addition, the proportion and the relative scale of the elements provided in the figures are intended to illustrate the examples of the disclosure, and should not be taken in a limiting sense.

FIG. 1 illustrates an example of an apparatus including a circuit to identify protection device failures consistent with the disclosure. The apparatus 100 may include a circuit 102, a power supply 104, a connector 106, a protection device 108, a protection fuse 110, a detection circuitry 112, an alert handling logic 114, a board logic 116, an electronic fuse 118, an internal power rail 120, and a power rail 122. In some examples, the protection fuse 110 may be an electronic fuse and/or a low current fuse.

For example, as illustrated in FIG. 1, the protection fuse 110 may be a low current fuse and may be positioned in series relative to the protection device 108. As used herein, the term "low-current" means that the breaking capacity of the maximum current that may be interrupted by the fuse is low relative to a fuse utilized for large equipment. For example, the apparatus 100 described herein may have a 12-volt power supply and therefore include the relatively low-current protection fuse 110, by way of comparison high-voltage equipment (e.g. 115,000 volts) may have high-current fuses. However, it should be noted that the voltage values used herein are by way of example and are not intended to be limiting voltages. As a result, voltage values consistent with the disclosure may be higher and/or lower.

As illustrated in FIG. 1, the power supply 104 may be a 12-volt power supply to provide power via utilizing the power rail 122 which may link to the connector 106. In some examples, the power rail 122 may convert mains electricity alternating current (AC) to low-voltage regulated direct current (DC) which may be used to power the components of an electrical component (e.g. a computing device, not explicitly shown). For example, the power rail 122 may receive AC power from the power supply 104 and convert it to DC power to be utilized by an electrical component such as a computing device.

As illustrated in FIG. 1, the connector 106 may link together the power supply 104, and the circuit 102. As used herein, the term "connector" means any type of device (e.g. mechanical and/or electrical) utilized to join two circuitry components (e.g. power rails and/or wires) such that power, signals, and/or other control applications are joined to create an operating circuit. For example, the connector 106 may link the power rail 122 and an internal power rail 120, thus linking the power supply 104 and the circuit 102. In some examples, the internal power rail 120 provides an internal signal path. For example, when the protection device 108 has failed, a signal (e.g. a charge and/or a current) may travel along the internal power rail 120 to reach a different portion of the circuit 102. In some examples, the connector 106 may be an electronic connector. For example, the connector 106 may be an electro-mechanical device used to join electrical terminations and create an electrical circuit.

As illustrated in FIG. 1, current may travel to the electronic fuse 118. For example, the current from the power supply 104 may travel along the internal power rail 120 to the electronic fuse 118 and then travel again along the internal power rail 120 to provide power the board logic 116. It should be understood that, although the electronic fuse 118 is illustrated in FIG. 1 as a single electronic fuse, multiple electronic fuses may be included in the apparatus 100.

As illustrated in FIG. 1, the protection device 108 receives current (e.g. a charge) from the power supply 104, that may travel along the internal power rail 120. In some examples, the protection device 108 may be a TVS diode. For example, the protection device 108 may be a TVS diode that may operate by shunting excess current when the power signal (e.g. a voltage) from the internal power rail 120 exceeds a threshold current (e.g. during a voltage spike). In some examples, the protection device 108 may fail (e.g. a device degradation), thus permitting the excess current to travel to the protection fuse 110.

For example, when the circuit 102 experiences an event (e.g. a voltage spike), the protection device 108 may experience a failure and the voltage may travel to the protection fuse 110, the voltage may open the protection fuse 110, and the majority of the voltage may travel to a grounded portion 124 of the circuit 102 and a portion of the voltage traveling on the internal power rail 120 may reach the detection circuitry 112.

In some examples, as illustrated in FIG. 1, the detection circuitry 112 may detect a signal (e.g. a current and/or a voltage) traveling on the internal power rail 120. For example, when the protection device 108 fails causing the protection fuse 110 to open, an amount of voltage will travel via the internal power rail 120 (e.g. an internal signal path) and the amount of voltage will operate as a signal to the detection circuitry 112 that the protection device 108 has failed, when the amount of voltage detected by the detection circuitry 112 is below a threshold which is further discussed in conjunction with FIG. 2. In some examples, the detection circuitry 112 may generate an alert in response to the detection of a failure of the protection device 108. For example, when the detection circuitry 112 detects a failure of the protection device 108 it may forward a generated alert to an alert handling logic 114, which may take appropriate action responsive to the alert generated by the detection circuitry 112.

In some examples, the alert handling logic 114 may be circuitry included in the board logic 116. As used herein, the term "board logic" means a printed circuit board with expansion capability and may include other components. Some examples of a printed circuit board may be a board logic, a motherboard, a mainboard, a system board, a baseboard, a planar board etc. It should be noted the examples listed are by way of example and are intended to be limiting. As used herein, the term "alert handling logic" means a peripheral component that may be included in the printed circuit board of a board logic. However, an alert handling logic may be capable of operating as an independent board logic. In some examples, the alert handling logic 114 may have capabilities to receive and respond to alerts from the detection circuitry 112.

In some examples, the alert handling logic 114 may take appropriate action to protect the electrical component from damage in response to receiving an alert generated by the detection circuitry 112 in response to failure of the protection device 108 and the protection fuse 110 opening. For example, the alert handling logic 114 may refrain from powering the circuit 102 when the protection device 108 has failed. In another example, the alert handling logic 114 may notify the board logic 116 in response to receiving an alert generated by the detection circuitry 112 that the protection device 108 has failed, and the board logic 116 may refrain from powering the circuit 102.

In some examples, the alert handling logic 114 may instruct devices external to the apparatus 100 to notify an end user that the protection device 108 has failed. For example, the alert handling logic 114 may receive an alert generated by the detection circuitry 112 that the protection device 108 has failed, and in response to receiving the alert, the alert handling logic 114 may provide instructions to trigger a warning to an end user, an electrical component, and/or a machine that the electrical component is no longer protected by the protection device 108. In some examples, the warning may be visual. For example, the alert handling logic 114 may provide instructions to illuminate a light (e.g. a light emitting diode) to visually alert an end user the electrical component is not protected. In some examples, the warning may be audible such that a user would hear an alarm in response to the alert handling logic 114 receiving an alert from the detection circuitry 112 that the protection device 108 has failed. In yet another example, the alert handling logic 114, in response to receiving an alert generated by the detection circuitry 112, may instruct an auxiliary system (e.g. a back-up system) to power the electrical component such that the circuit 102 may be removed from commission. While the preceding examples refer to the alert handling logic 114, it should be understood that the preceding example operations may be carried out independent of, and/or in conjunction with, the board logic 116.

Figure 2:
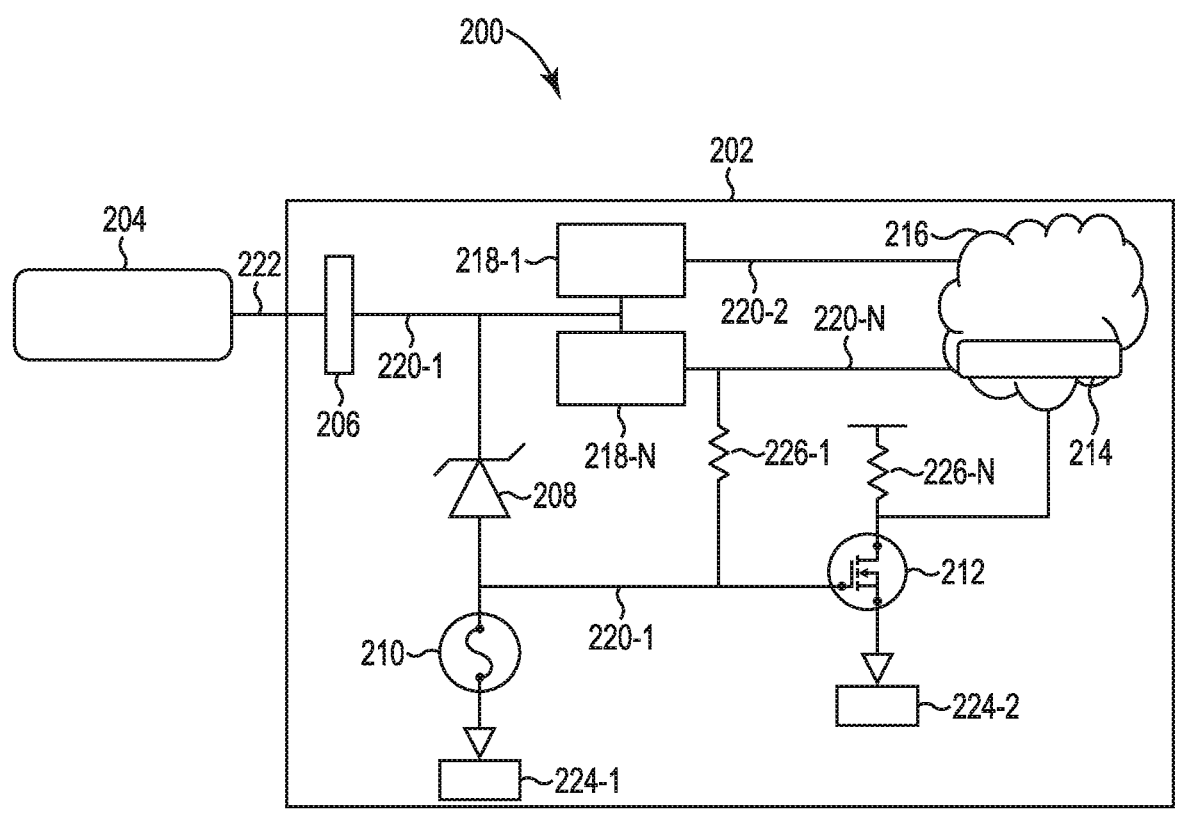
FIG. 2 illustrates yet another example of an apparatus including a circuit to identify protection device failures consistent with the disclosure.

FIG. 2 illustrates yet another example of an apparatus including a circuit to identify protection device failures consistent with the disclosure. The apparatus 200 may include the circuit 202, the power supply 204, the connector 206, the protection device 208, the protection fuse 210, the detection circuitry 212, the alert handling logic 214, the board logic 216, the electronic fuse 218-1, . . . , 218-N, the internal power rail 220-1, . . . , 220-N, and the power rail 222. In some examples, there may be one or more electronic fuse 218-1, . . . , 218-N.

For example, as illustrated in FIG. 2, the circuit 202 may include a plurality of electronic fuses 218-1, . . . , 218-N. While FIG. 2 is illustrated as including two electronic fuses 218-1, . . . , 218-N it should be understood that the circuit 202 may have more or less than two electronic fuses 218-1, . . . , 218-N. In some examples, the circuit 202 may have a plurality internal power rails 220-1, 220-2, . . . , 220-N. For example, as illustrated in FIG. 2, the internal power rail 220-1 of the circuit 202 may be linked by the connector 206 to the power rail 222, and the internal power rail 220-1 may operate to provide power to the circuit 202 and as an internal signal path. In some examples, the internal power rail(s) 220-2, . . . , 220-N may function similarly to internal power rail 220-1. For example, the internal power rail 220-2 may link the electronic fuse 218-1 to facilitate a current traveling throughout the circuit 202 and/or as an internal signal path. Similarly, the fuse 218-N may link to the internal power rail 220-N to facilitate a current traveling throughout the circuit 202 and/or as an internal signal path. While FIG. 2 is illustrated as including three internal power rails 220-1, 220-2, . . . , 220-N it should be understood that the circuit 202 may have more or less than three internal power rails 220-1, 220-2, . . . , 220-N.

As illustrated in FIG. 2, the power supply 204 may provide power to the circuit 202, while the internal power rail 220-1 facilitates the travel of power to the protection device 208. For example, the protection device 208 may experience a failure and the protection fuse 210 may open in response to the failure and direct the excess current in the internal power rail 220-1 to the grounded portion 224, and the internal power rail 220-1 may direct a low voltage to the detection circuitry 212. In some examples, the detection circuitry 212 may detect the low voltage as below a particular threshold (e.g. a logical value of "0"), when the protection device 208 has experienced a failure, and in response to detecting the low voltage the detection circuitry 212 may generate an alert to indicate that the protection device 208 has failed. Continuing with the preceding example, the internal power rail 220-1 may operate as an internal signal path and transfer the alert generated by the detection circuitry 212 to the alert handling logic 214, which may take appropriate action responsive to the alert generated by the detection circuitry 212. Conversely, in some examples, the detection circuitry 212 may detect a high voltage as a voltage that is above a particular threshold. For example, the protection device 208 may not experience a failure (e.g. the protection device is maintaining normal operation) and the protection fuse 210 may not open (e.g. will not operate) and the internal power rail 220-1 may direct the high voltage to the detection circuitry 212 and to the resistors 226-1, . . . , 226-N. In some examples, the detection circuitry 212 may detect the high voltage as above the particular threshold (e.g. a logical value of "1") when the protection device 208 is operating normally. That is, in some examples, the detection circuitry 212 may detect a particular value (e.g. a "1" or a "0") based on the detected voltage traveling in the circuit 202 as above or below a particular threshold. For example, the detection circuitry 212 reports a status (e.g. an alert) that the protection device 208 is operable when the detected voltage is above a particular threshold and the detection circuitry 212 reports a status (e.g. an alert) that the protection device 208 has experienced a failure when the detected voltage is below a particular threshold.

As illustrated in FIG. 2, the detection circuitry 212 may detect current above and/or below a particular threshold. In some examples, the detection circuitry 212 may include other integrated circuitry such as a gate, a logic gate, an application specific integrated circuit (ASIC), and/or a field programmable gate array (FPGA). For example, the detection circuitry 212 may report the status of the protection device 208 to at least one of an ASIC and/or a FPGA. In some examples, the detection circuitry 212 may include a gate. For example, when the detection circuitry 212 detects a low voltage (e.g. when the protection device 208 has experienced a failure) the low voltage may be gated by the detection circuitry 212. In another example, when the detection circuitry 212 detects a high voltage (e.g. when the protection device is operating normally), the high voltage may be above a threshold voltage such that the voltage may overcome the gate and travel to the one or more resistors 226-N.

Figure 3:
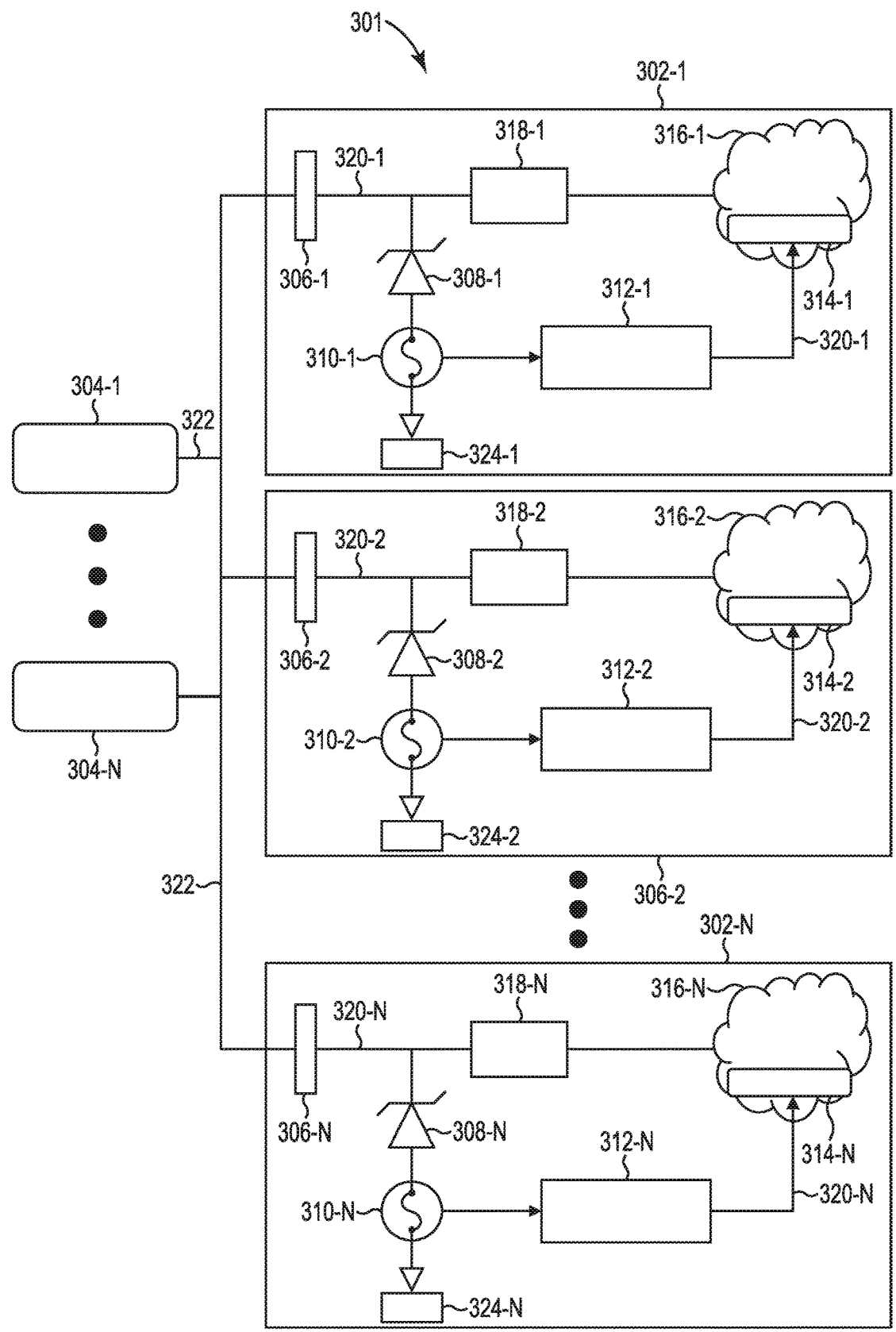
FIG. 3 illustrates example of a system including at least one circuit to identify protection device failures consistent with the disclosure.

FIG. 3 illustrates example of a system including at least one circuit to identify protection device failures consistent with the disclosure. The system 301 may include a plurality of circuits 302-1, . . . , 302-N, at least one power supply 304-1, . . . , 304-N, a plurality of connectors 306, . . . , 306-N, a plurality of protection devices 308-1, . . . , 308-N, a plurality of protection fuses 310-1, . . . , 310-N, at least one detection circuitry 312-1, . . . , 312-N, at least one alert handling logic 314-1, . . . , 314-N, at least one board logic 316-1, . . . , 316-N, a plurality of electronic fuses 318-1, . . . , 318-N, at least one internal power rail 320-1, . . . , 320-N, and a power rail 322. In some examples, the plurality of circuits 302-1, . . . 302-N may operate as protection circuits for at least one electrical components (not explicitly shown).

For example, the system 301 may include the at least one power supply 304-1, . . . , 301-N to provide power to the plurality of circuits 302-1, . . . , 302-N via a shared power system utilizing the power rail 322. As used herein, the term "shared power system" means one or more power supplies that may utilize a power rail that will facilitate the travel of power to one or more circuits. In some examples, each of the plurality of circuits 302-1, . . . , 302-N may direct a power signal from the at least one power supply 304-1, . . . , 304-N to at least one electrical component. For example, the circuit 302-1 may power an electrical component independently of the circuit 302-2, which may power an electrical component independently of the circuit 302-N. While FIG. 3 illustrates the system 301 including the three example circuits 302-1, 302-2, 302-N, and the two example power supplies 304-1, 304-N it should be understood that some examples may have more or less than the illustrated example circuits and the corresponding components and associated power supplies. In some examples, the protection device 308-1, . . . , 308-N associated with each of the circuits 302-1, . . . , 302-N may operate to protect the respective electrical component independently of other circuits sharing the power supply 304-1, . . . , 304-N.

For example, when the protection device 308-2 of the circuit 302-2 experiences a failure, the excessive current traveling on the internal power rail 320-2 may cause the protection fuse 310-2 to operate (e.g. to short circuit) sending the excess current to the grounded portion 324-2. Continuing with the preceding example, a low current may be detected by the detection circuitry 312-2 and in response to a determination that the low current is below a particular threshold the detection circuitry 312-2 may generate an alert indicating that the protection device 308-2 has experienced a failure. Continuing with the preceding example, the alert handling logic 314-2 may receive the generated alert and may take appropriate action responsive to the alert generated by the detection circuitry 312-2. In some examples, the alert handling logic 314-2 may direct the circuit 302-2 to refrain from sending a signal (e.g. a current) to the electrical component associated with the circuit 302-2.

For example, when a failure of the protection device 308-2 is detected by the detection circuitry 312-2, the alert handling logic 314-2 may take appropriate action to protect the unprotected electrical component. The action taken in this example may be independent of the other circuits 302-1, . . . , 302-N of the system 301. For example, the alert handling logic 314-2 may instruct the circuit 302-2 to refrain from powering the associated electrical component, the actions of the alert handling logic 314-2 do not affect the operation of the circuit 302-1, . . . , 302-N. It should be understood that the preceding examples should not be taken as limiting and may be applicable to any of the circuits 302-1, . . . , 302-N, of system 301.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. As used herein, designators such as "N", etc., particularly with respect to reference numerals in the drawings, indicate that a number of the particular feature so designated can be included. A "plurality of" is intended to refer to more than one of such things.

What is claimed:
1. An apparatus comprising:
a circuit to direct a power signal to at least one electrical component, the circuit comprising:
a protection device to regulate power to the at least one electrical component and protect the at least one electrical component from damage;
a protection fuse that is coupled in series with the protection device;
detection circuitry to determine a failure of the protection device, wherein the failure of the protection device causes the protection fuse to open and a signal corresponding to the failure of the protection device to travel to an alert handling logic; and
the alert handling logic to receive the signal corresponding to a failure of the protection device from the detection circuitry.
2. The apparatus of claim 1, wherein the signal corresponding to the failure of the protection device is based on a voltage detected by the detection circuitry.
3. The apparatus of claim 1, wherein the protection device comprises an asymmetric conductance circuit component.
4. The apparatus of claim 1, wherein the apparatus refrains from powering the circuit in response to the detection that the protection device has failed.
5. The apparatus of claim 1, wherein the protection fuse comprises a low current protection fuse.
6. The apparatus of claim 5, wherein the detection circuitry detects a current supplied to the low current protection fuse.
7. The apparatus of claim 1, wherein the protection fuse comprises an electronic protection fuse.
8. The apparatus of claim 1, wherein the detection circuitry generates an alert responsive to failure of the protection device.
9. The apparatus of claim 1, wherein the detection circuitry determines if the protection device has experienced a short circuit.
10. An apparatus comprising:
a circuit to direct a signal to at least one electrical component, the circuit comprising a detection circuitry device to:
detect a status of a protection device, wherein the protection device is coupled in series with a protection fuse;
report the status of the protection device to an alert handling logic, wherein the alert handling logic refrains from powering the circuit when the protection device has a failed status, wherein when the protection device has failed, the protection fuse opens and a signal corresponding to the failure of the protection device travels to the alert handling logic to report the status of the protection circuit to the alert handling logic.
11. The apparatus of claim 10, wherein the protection fuse includes a low current protection fuse.
12. The apparatus of claim 10, wherein the detection circuitry reports the status of the protection device to at least one of an application specific integrated circuit (ASIC) and a field programmable gate array (FPGA) coupled to the circuit.

13. The apparatus of claim 10, wherein the detection circuitry reports the status of the protection device as failed when a detected voltage is less than a particular threshold.

14. The apparatus of claim 10, wherein the detection circuitry reports the status of the protection device as operable when a detected voltage exceeds a particular threshold.

15. The apparatus of claim 10, wherein the circuit refrains from directing the signal to the at least one electrical component when the detection circuitry reports a failed protection device.

16. A system comprising:
   at least one power supply to provide a signal to at least one electrical component;
   a plurality of circuits to direct the signal from the at least one power supply to the at least one electrical component, each circuit of the plurality of circuits comprising:
      a protection device to regulate power to the at least one electrical component and protect the electrical component from damage;
      a protection fuse that is coupled in series with the protection device;
      detection circuitry to detect when the protection device has failed; and
      alert handling logic to receive an alert in response to the detection circuitry determining that the protection device has failed, wherein when the protection device has failed, the protection fuse opens and a signal corresponding to the failure of the protection device travels to the alert handling logic.

17. The system of claim 16, wherein the protection fuse includes a low current protection fuse that short circuits in response to the failure of the protection device.

18. The system of claim 16, wherein the alert handling logic includes a Light-Emitting Diode (LED) to alert a user of the failure of the protection device.

19. The system of claim 16, wherein a particular circuit of the plurality of circuits refrains from directing the signal to the at least one electrical component when the detection circuitry reports a failed protection device.

20. The apparatus of claim 1, wherein the protection device includes a transient voltage suppressor (TVS) diode.

\* \* \* \* \*